United States Patent
Akiyama et al.

(10) Patent No.: US 12,349,434 B2
(45) Date of Patent: Jul. 1, 2025

(54) MANUFACTURING METHOD FOR SEMICONDUCTOR DEVICE

(71) Applicant: Tokyo Electron Limited, Tokyo (JP)

(72) Inventors: Koji Akiyama, Yamanashi (JP); Chihiro Tamura, Yamanashi (JP); Philippe Gaubert, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 225 days.

(21) Appl. No.: 18/024,971

(22) PCT Filed: Sep. 1, 2021

(86) PCT No.: PCT/JP2021/032045
§ 371 (c)(1),
(2) Date: Mar. 7, 2023

(87) PCT Pub. No.: WO2022/059482
PCT Pub. Date: Mar. 24, 2022

(65) Prior Publication Data
US 2023/0326977 A1    Oct. 12, 2023

(30) Foreign Application Priority Data
Sep. 15, 2020 (JP) .................. 2020-154747

(51) Int. Cl.
*H10D 64/01* (2025.01)
*H01L 21/02* (2006.01)
(Continued)

(52) U.S. Cl.
CPC ....... *H10D 64/01* (2025.01); *H01L 21/02175* (2013.01); *H01L 21/02178* (2013.01);
(Continued)

(58) Field of Classification Search
CPC ............ H01L 29/401; H01L 21/02175; H01L 21/02178; H01L 21/02181;
(Continued)

(56) References Cited

U.S. PATENT DOCUMENTS

2008/0171411 A1 * 7/2008 Takata .............. H01L 29/42332
257/E29.302
2008/0246078 A1 10/2008 Hou et al.
(Continued)

FOREIGN PATENT DOCUMENTS

JP         56-161669 A    12/1981
JP         H08-017939 A    1/1996
(Continued)

OTHER PUBLICATIONS

International Search Report and Written Opinion mailed on Nov. 2, 2021, received for PCT Application PCT/JP2021/032045, filed on Sep. 1, 2021, 9 pages including English Translation.

*Primary Examiner* — Julia Slutsker
(74) *Attorney, Agent, or Firm* — XSENSUS LLP

(57) ABSTRACT

A manufacturing method for a semiconductor device includes forming a dielectric film on a semiconductor substrate or on a lower electrode that is formed on a semiconductor substrate, attaching a metal to a predetermined area on a surface of the dielectric film selectively, forming a metal oxide film with an insulation property in the predetermined area on the surface of the dielectric film by applying heat treatment to the metal, and forming an upper electrode on the dielectric film in a state where the metal oxide film is formed in the predetermined area on the surface of the dielectric film.

9 Claims, 8 Drawing Sheets

(51) Int. Cl.
*H01L 21/288* (2006.01)
*H10D 1/68* (2025.01)

(52) U.S. Cl.
CPC .. *H01L 21/02181* (2013.01); *H01L 21/02183* (2013.01); *H01L 21/02189* (2013.01); *H01L 21/02337* (2013.01); *H01L 21/288* (2013.01); *H10D 1/68* (2025.01)

(58) Field of Classification Search
CPC ......... H01L 21/02183; H01L 21/02189; H01L 21/02337; H01L 21/288
See application file for complete search history.

(56) References Cited

U.S. PATENT DOCUMENTS

| | | | | |
|---|---|---|---|---|
| 2015/0031196 A1* | 1/2015 | Sato | ................... | H01L 21/0228 |
| | | | | 438/591 |
| 2019/0115409 A1* | 4/2019 | Huh | ................... | H01L 27/1214 |

FOREIGN PATENT DOCUMENTS

| | | | |
|---|---|---|---|
| JP | 2005-079186 | A | 3/2005 |
| JP | 2007-088301 | A | 4/2007 |
| JP | 2007-294874 | A | 11/2007 |
| JP | 2012-080095 | A | 4/2012 |

* cited by examiner

MANUFACTURING METHOD FOR SEMICONDUCTOR DEVICE

CROSS-REFERENCE TO RELATED APPLICATIONS

This application is national stage application of International Application No. PCT/JP2021/032045, filed Sep. 1, 2021, which designates the United States, incorporated herein by reference, and which claims the benefit of priority from Japanese Patent Application No. 2020-154747, filed Sep. 15, 2020, the entire contents of which are incorporated herein by reference.

FIELD

The present disclosure relates to a manufacturing method for a semiconductor device.

BACKGROUND

Patent Literatures 1, 2 disclose techniques to form a metal oxide film with an isolation property on a dielectric film that is provided as a capacitor insulating film between an lower electrode and an upper electrode or a gate insulating film, in a manufacturing step for a semiconductor device, according to an ALD (Atomic Layer Deposition) method. It is possible for a metal oxide film with an insulation property to reduce a leakage current of a dielectric film.

The present disclosure provides a technique that is capable of reducing a leakage current of a dielectric film without increasing a capacitance equivalent film thickness (CET: Capacitance Equivalent Thickness) thereof.

SUMMARY

A manufacturing method for a semiconductor device, includes: forming a dielectric film on a semiconductor substrate or on a lower electrode that is formed on a semiconductor substrate; attaching a metal to a predetermined area on a surface of the dielectric film selectively; forming a metal oxide film with an insulation property in the predetermined area on the surface of the dielectric film by applying heat treatment to the metal; and forming an upper electrode on the dielectric film in a state where the metal oxide film is formed in the predetermined area on the surface of the dielectric film.

DETAILED DESCRIPTION

Figure 1:
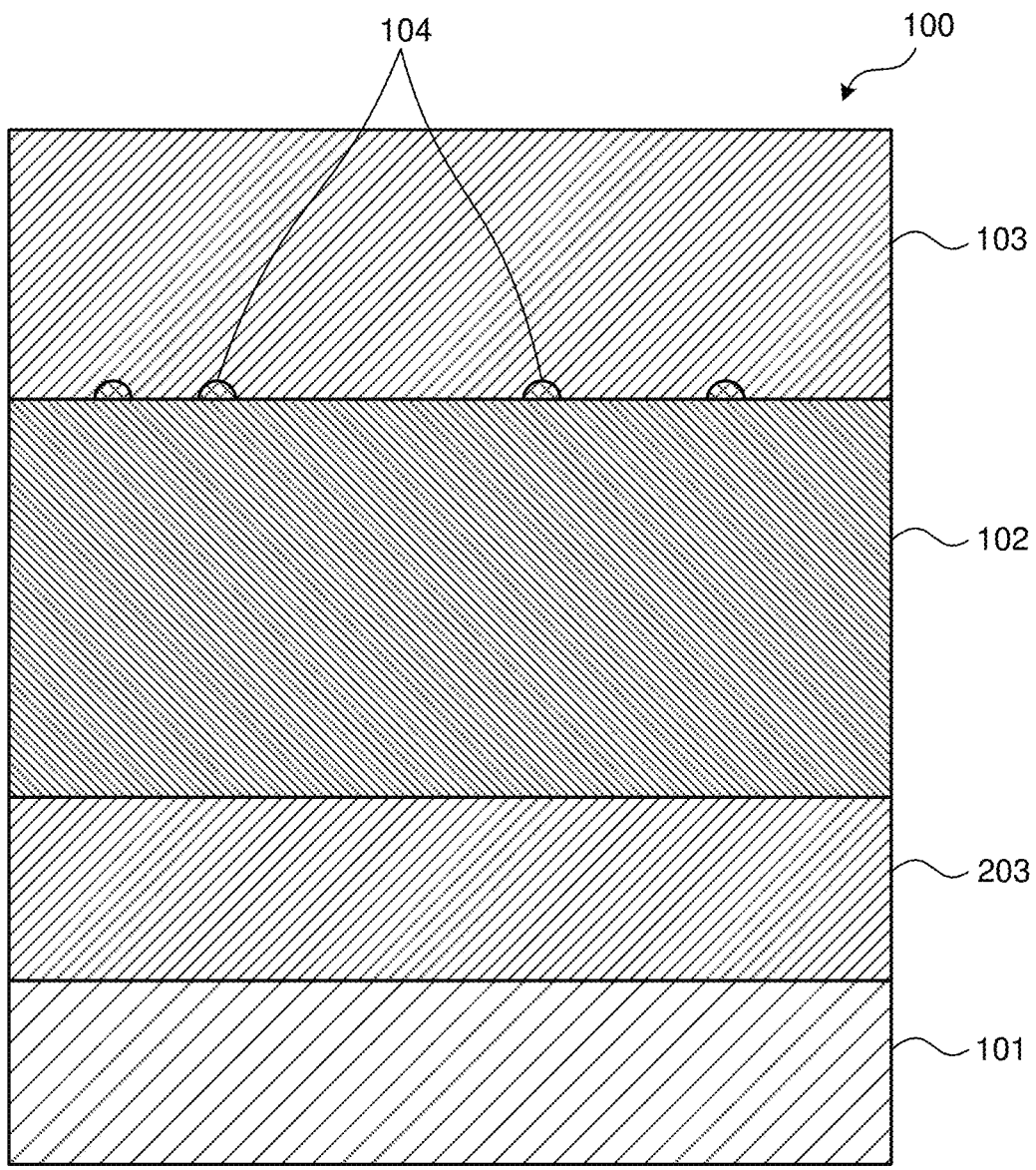
FIG. 1 is a diagram that illustrates an example of a structure of a semiconductor device according to an embodiment.

Hereinafter, a variety of embodiments will be explained in detail, with reference to the drawing(s). Additionally, a disclosed technique(s) is/are not limited by an embodiment(s) as provided below.

Meanwhile, for a technique to form a metal oxide film with an insulation property on a dielectric film according to an ADL method, there is room for improvement in that a leakage current of such a dielectric film is reduced without increasing a CET thereof.

Hence, the present disclosure provides a technique that is capable of reducing a leakage current of a dielectric film without increasing a CET thereof.

Structure of Semiconductor Device

FIG. 1 is a diagram that illustrates an example of a structure of a semiconductor device according to an embodiment. A semiconductor device 100 as illustrated in FIG. 1 is a semiconductor device with an MIM (Metal-Insulator-Metal) structure. The semiconductor device 100 has a semiconductor substrate 101, a lower electrode 203 that is formed on the semiconductor substrate 101, a dielectric film 102 that is formed on the lower electrode 203, and an upper electrode 103 that is formed on the dielectric film 102. In the semiconductor device 100 with an MIM structure, the dielectric film 102 is utilized as a capacitor insulating film between the upper electrode 103 and the lower electrode 203. A metal oxide film 104 with an insulation property is locally formed in a predetermined area on a surface of the dielectric film 102.

Manufacturing Method for Semiconductor Device

Figure 2:
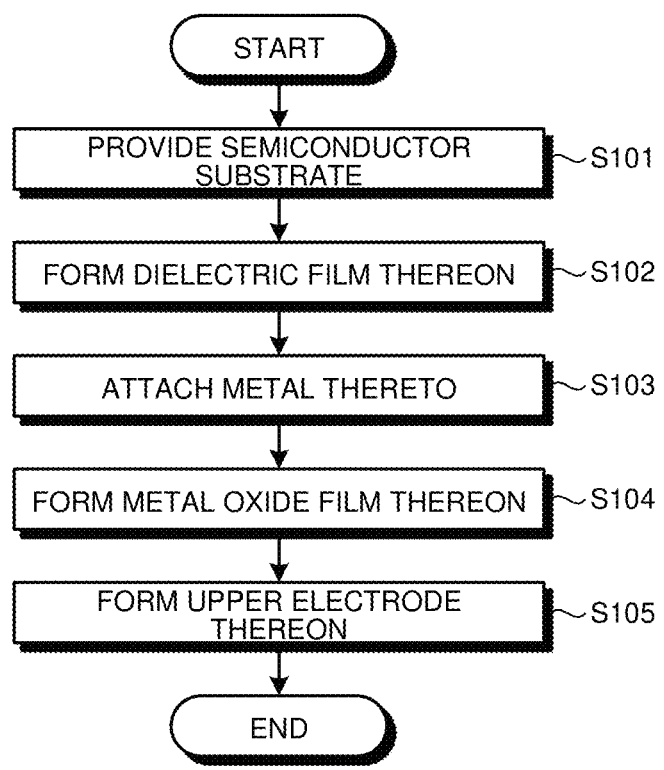
FIG. 2 is a flowchart that illustrates an example of a manufacturing method for a semiconductor device according to an embodiment.

FIG. 2 is a flowchart that illustrates an example of a manufacturing method for a semiconductor device according to an embodiment. FIG. 3 to FIG. 6 are cross-sectional views that illustrate an example of a state of a processing target in each step of a manufacturing method for a semiconductor device according to an embodiment.

First, a semiconductor substrate 101 where a lower electrode 203 is formed is provided (step S101). The semiconductor substrate 101 is, for example, a silicon substrate, etc. The lower electrode 203 is, for example, titanium nitride (TiN).

Figure 3:
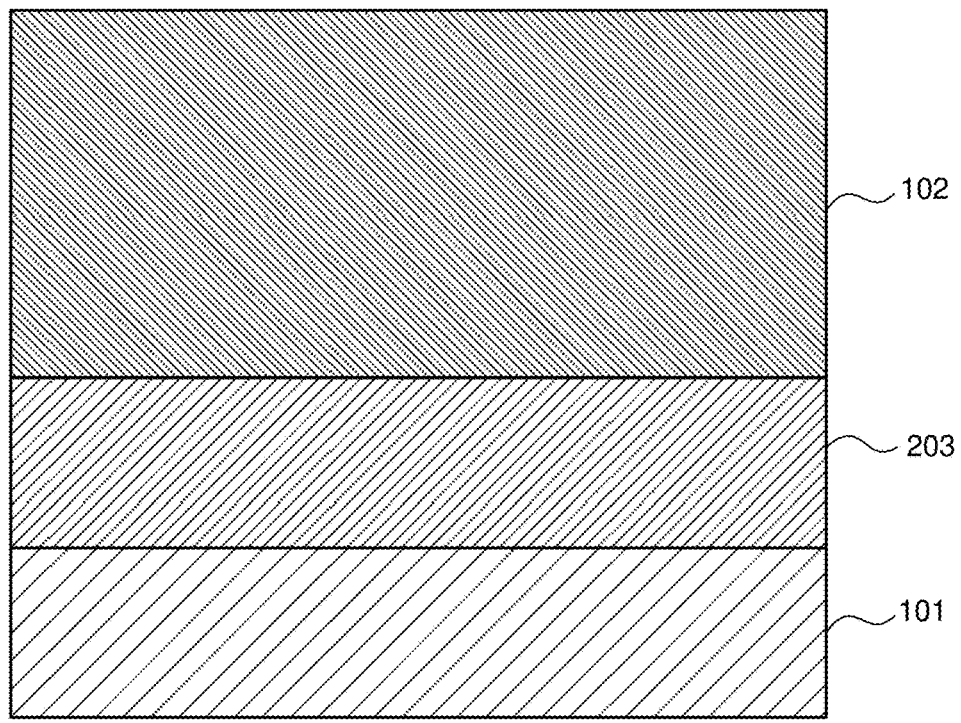
FIG. 3 is a cross-sectional view that illustrates an example of a state of a processing target in each step of a manufacturing method for a semiconductor device according to an embodiment.

Then, a dielectric film 102 is formed on the lower electrode 203 (step S102, see FIG. 3). The dielectric film 102 includes, for example, hafnium oxide (HfO2) or zirconium oxide (ZrO2).

Figure 4:
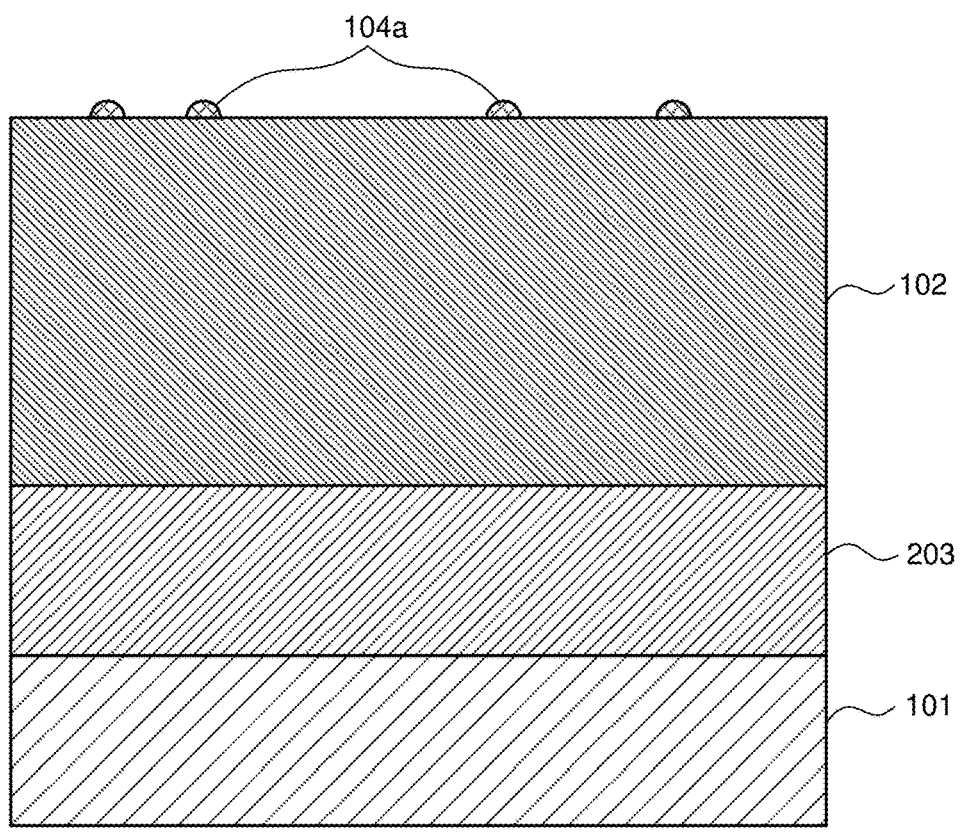
FIG. 4 is a cross-sectional view that illustrates an example of a state of a processing target in each step of a manufacturing method for a semiconductor device according to an embodiment.

Then, a metal 104a is selectively attached to a predetermined area on a surface of the dielectric film 102 (step S103, a metal attachment step, see FIG. 4). The metal 104a includes, for example, aluminum (Al) or a pentavalent transition metal. Such a pentavalent transition metal includes, for example, niobium (Nb) or tantalum (Ta).

Figure 7:
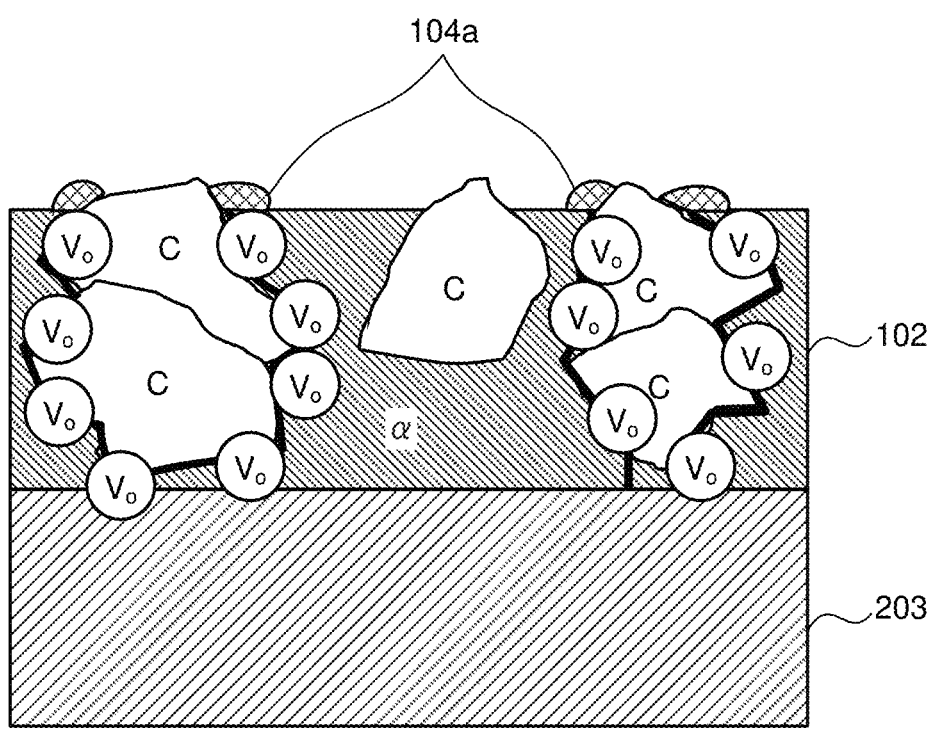
FIG. 7 is a diagram for explaining a detail of a metal attachment step in an embodiment.

Herein, a detail of a metal attachment step at step S103 will be explained with reference to FIG. 7. FIG. 7 is a diagram for explaining a detail of a metal attachment step in an embodiment. A dielectric film 102 includes a crystal part C that is a crystalized part, and an amorphous part a that is a non-crystalized part. On a crystal grain boundary that is a boundary surface of a crystal part C, an aggregate where a plurality of oxygen defects $V_O$ are aggregated is formed. A part of a crystal grain boundary is exposed to a surface of the dielectric film 102. In a metal attachment step, as illustrated in FIG. 7, a metal 104a is selectively attached to an area that includes a periphery of a crystal grain boundary that is exposed to a surface of the dielectric film 102 (that will be called a "grain boundary peripheral area" below). In a metal attachment step, a plating process that uses an electron(s) that is/are conducted through a crystal grain boundary that is present in the dielectric film 102 (for example, an electrolytic plating process) is executed, so that the metal 104a is selectively attached to a grain boundary peripheral area on a surface of the dielectric film 102. That is, a path for conducting an electron(s) from a lower electrode 203 to a surface of the dielectric film 102 is formed on a crystal grain boundary that is present in the dielectric film 102, due to an aggregate of oxygen defects $V_O$. In a metal attachment step, a metal ion in an electrolyte solution is reduced by an electron(s) that is/are conducted through such a path and is/are supplied to a crystal grain boundary on a surface of the dielectric film 102, so that the metal 104a is selectively attached to a grain boundary peripheral area on a surface of the dielectric film 102.

Figure 5:
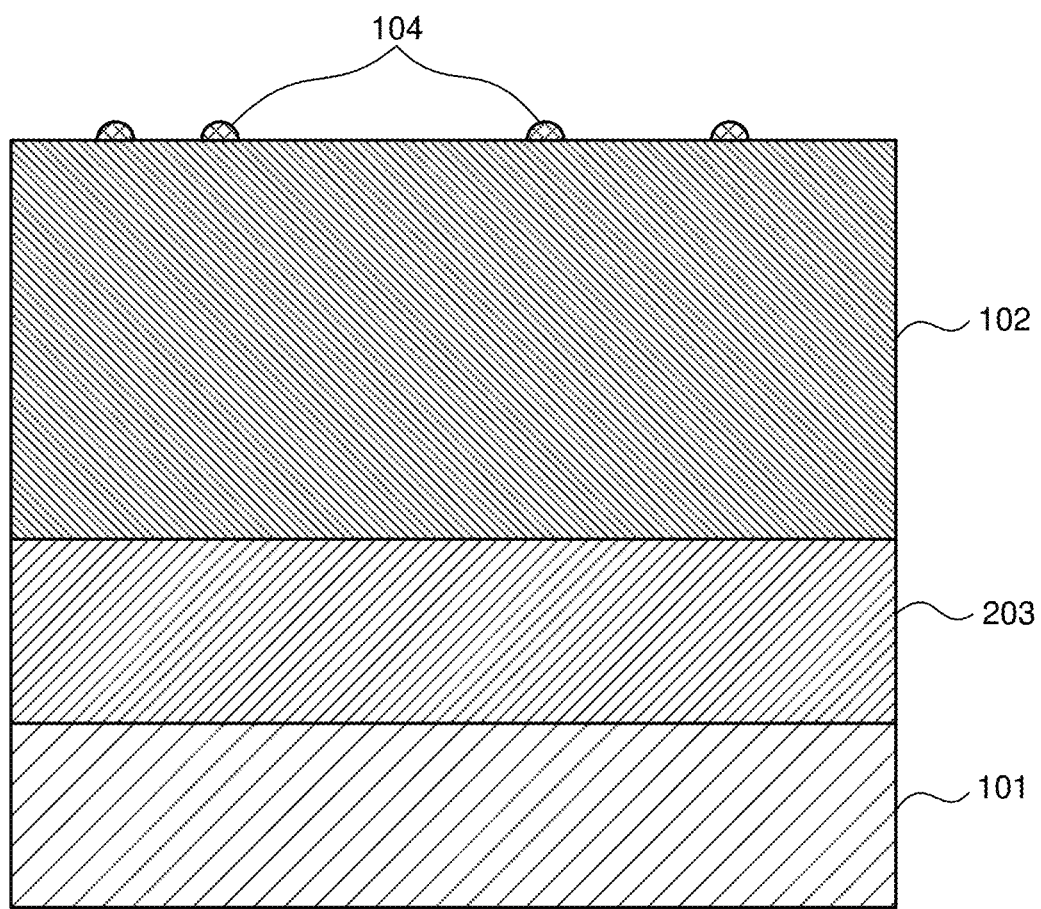
FIG. 5 is a cross-sectional view that illustrates an example of a state of a processing target in each step of a manufacturing method for a semiconductor device according to an embodiment.
Figure 6:
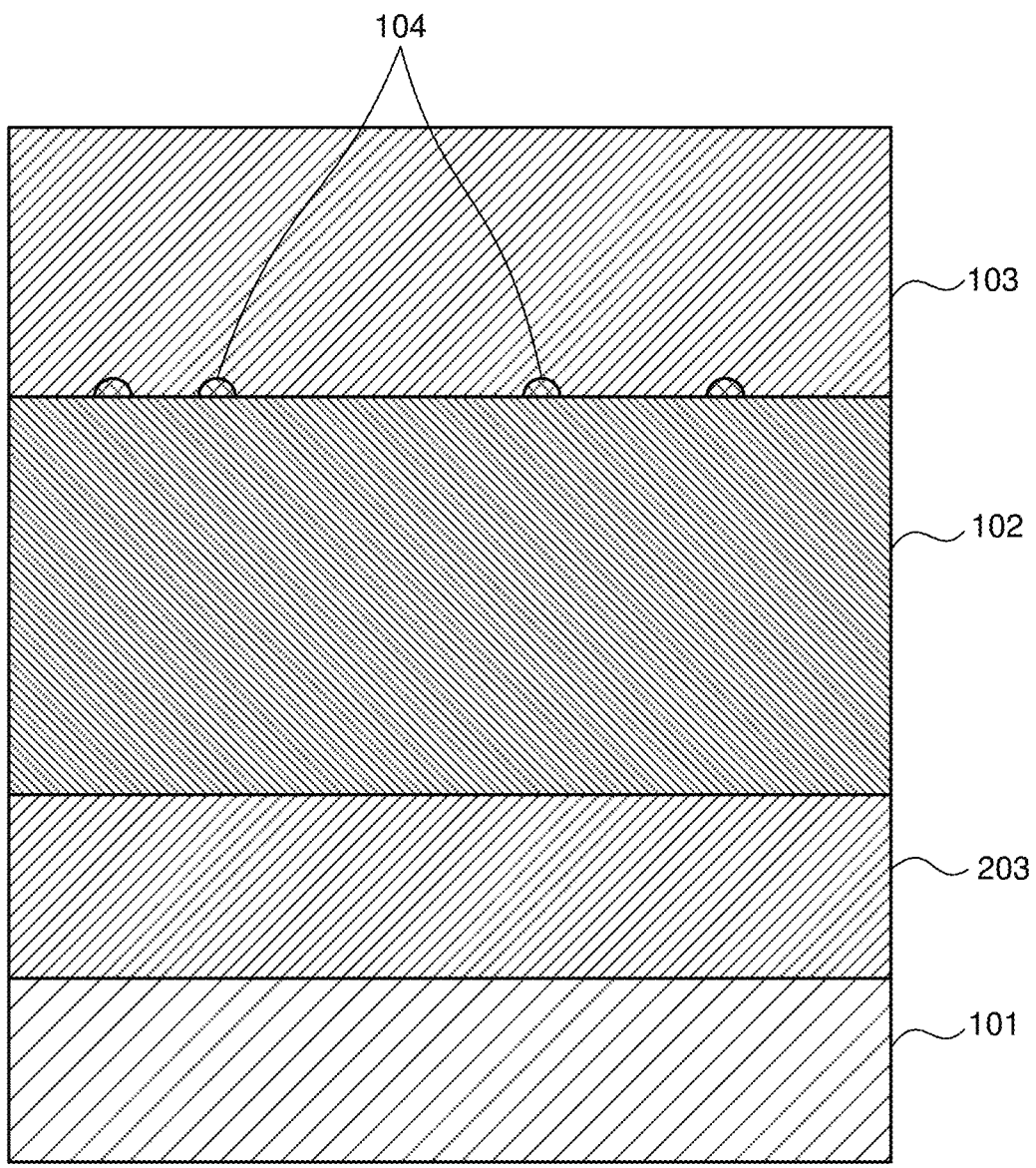
FIG. 6 is a cross-sectional view that illustrates an example of a state of a processing target in each step of a manufacturing method for a semiconductor device according to an embodiment.

Then, heat treatment is applied to the metal 104a, so that a metal oxide film 104 with an insulation property is formed in a predetermined area (that is, a grain boundary peripheral area) on a surface of the dielectric film 102 (step S104, see FIG. 5). The metal oxide film 104 is, for example, aluminum oxide (Al2O3), niobium oxide (Nb2O5), or tantalum oxide (Ta2O5). From a viewpoint that the metal oxide film 104 is grown properly, it is preferable that a step at step S104 is executed at, for example, a temperature of 300° C. or lower.

In a step at step S104, for example, in a case where the dielectric film 102 is hafnium oxide (Hf2O) and the metal oxide film 104 is niobium oxide (Nb2O5), chemical reactions proceed that are represented by chemical reaction formulas (1), (2) as described below.

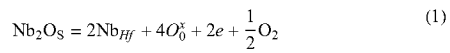

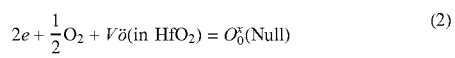

According to a chemical reaction of chemical reaction formula (1), two Nb atoms of niobium oxide (Nb2O5) are incorporated into a site of a Hf atom in a crystal of hafnium oxide (HfO2) and four O atoms of niobium oxide are incorporated into a site of an O atom in a crystal of hafnium oxide. Furthermore, according to a chemical reaction of chemical reaction formula (1), two electrons and one O atom are left.

According to a chemical reaction of chemical reaction formula (2), two electrons and one O atom that are left are incorporated into an oxygen defect $V_O$ on a crystal grain boundary on a surface of hafnium oxide (the dielectric film 102). Thereby, an oxygen defect $V_O$ that is a path for an electron(s) disappears near a surface of hafnium oxide (HfO2) and a periphery of a crystal grain boundary on a surface of hafnium oxide is electrically sealed with the metal oxide film 104. As a result, it is possible to reduce a leakage current of the dielectric film 102.

Additionally, even in a case where the metal oxide film 104 is tantalum oxide (Ta2O5), similar chemical reactions are estimated to proceed, and as a result, it is possible to reduce a leakage current of the dielectric film 102. Furthermore, in a case where the metal oxide film 104 is aluminum oxide (Al2O3), a covalent bond character of an Al—O bond of aluminum oxide is strong and a bandgap thereof is large, so that tunneling of an electron is reduced or prevented, and as a result, it is possible to reduce a leakage current of the dielectric film 102.

Furthermore, in a step at step S104, the metal oxide film 104 is selectively formed in only a grain boundary peripheral area on a surface of the dielectric film 102, differently from a conventional technique where a metal oxide film is formed on a whole of a surface of the dielectric film 102 according to an ALD method. Thereby, it is possible to reduce or prevent an increase of a CET of the dielectric film 102.

Then, an upper electrode 103 is formed on the dielectric film 102 (step S105, see FIG. 6) and such a process is ended. The upper electrode 103 is, for example, titanium nitride (TiN).

CET and Leakage Current of Dielectric Film 102

Figure 8:
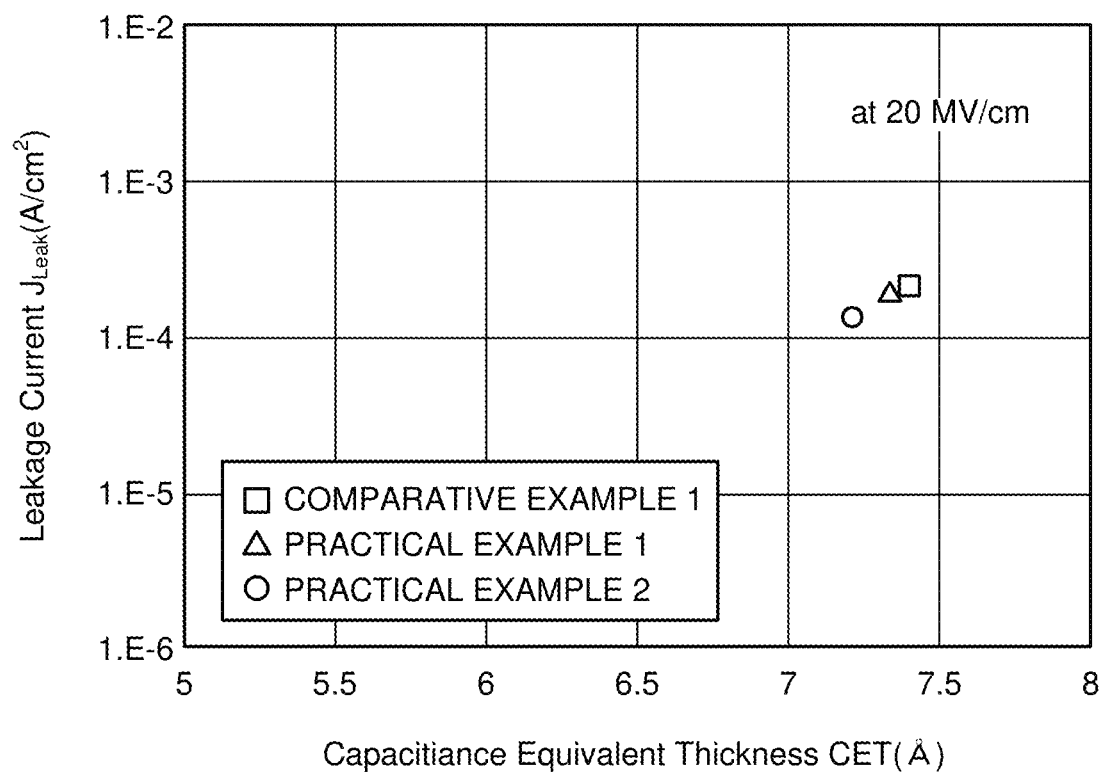
FIG. 8 is a diagram that illustrates an example of a result of measurement of a CET and a leakage current of a dielectric film.

FIG. 8 is a diagram that illustrates an example of a result of measurement of a CET and a leakage current of a dielectric film 102. FIG. 8 illustrates a result of measurement in a case where an upper electrode 103 of titanium nitride (TiN) is formed on a dielectric film 102 of zirconium oxide (ZrO2).

Comparative Example 1 in FIG. 8 indicates a result of a case where an upper electrode 103 is formed directly on a dielectric film 102 without forming a metal oxide film 104. Practical Example 1 in FIG. 8 indicates a result of a case where a metal 104a is attached to a grain boundary peripheral area on a surface of a dielectric film 102 by a plating process under a processing condition of a processing time/a current/a total charge quantity=1 min/3 mA/0.2 C so as to form a metal oxide film 104 and subsequently an upper electrode 103 is formed thereon. Practical Example 2 in FIG. 8 indicates a result of a case where a metal 104a is attached to a grain boundary peripheral area on a surface of a dielectric film 102 by a plating process under a processing condition of a processing time/a current/a total charge quantity=10 min/10 mA/6.7 C so as to form a metal oxide film 104 and subsequently an upper electrode 103 is formed thereon. In Practical Examples 1, 2, such a metal 104a is aluminum and such a metal oxide film 104 is aluminum oxide (Al2O3).

As seen in FIG. 8, an increase of a CET of a dielectric film 102 is reduced or prevented and a leakage current thereof is reduced in a case where a metal oxide film 104 is formed as compared with a case where such a metal oxide film 104 is not formed. That is, in a manufacturing method for a semiconductor device according to an embodiment where a metal oxide film 104 is formed in a grain boundary peripheral area on a surface of a dielectric film 102 prior to formation of an upper electrode 103, it is possible to reduce a leakage current of such a dielectric film 102 without increasing a CET thereof. Moreover, as seen from a result of FIG. 8, a CET of a dielectric film 102 is reduced in a case where a metal oxide film 104 is formed as compared with a case where such a metal oxide film 104 is not formed. That is, in a manufacturing method for a semiconductor device according to an embodiment where a metal oxide film 104 is formed in a grain boundary peripheral area on a surface of a dielectric film 102 prior to formation of an upper electrode 103, it is also possible to reduce a CET of such a dielectric film 102. It is considered that a reason why a CET of the dielectric film 102 is reduced is that an irregularity/irregularities that is/are based on an oxide of a plating substance is/are formed on a surface of the dielectric film 102 (a ZrO2 film) by a plating process so that Capacitance of the dielectric film 102 is increased with increasing an effective surface area thereof.

Variation

Figure 9:
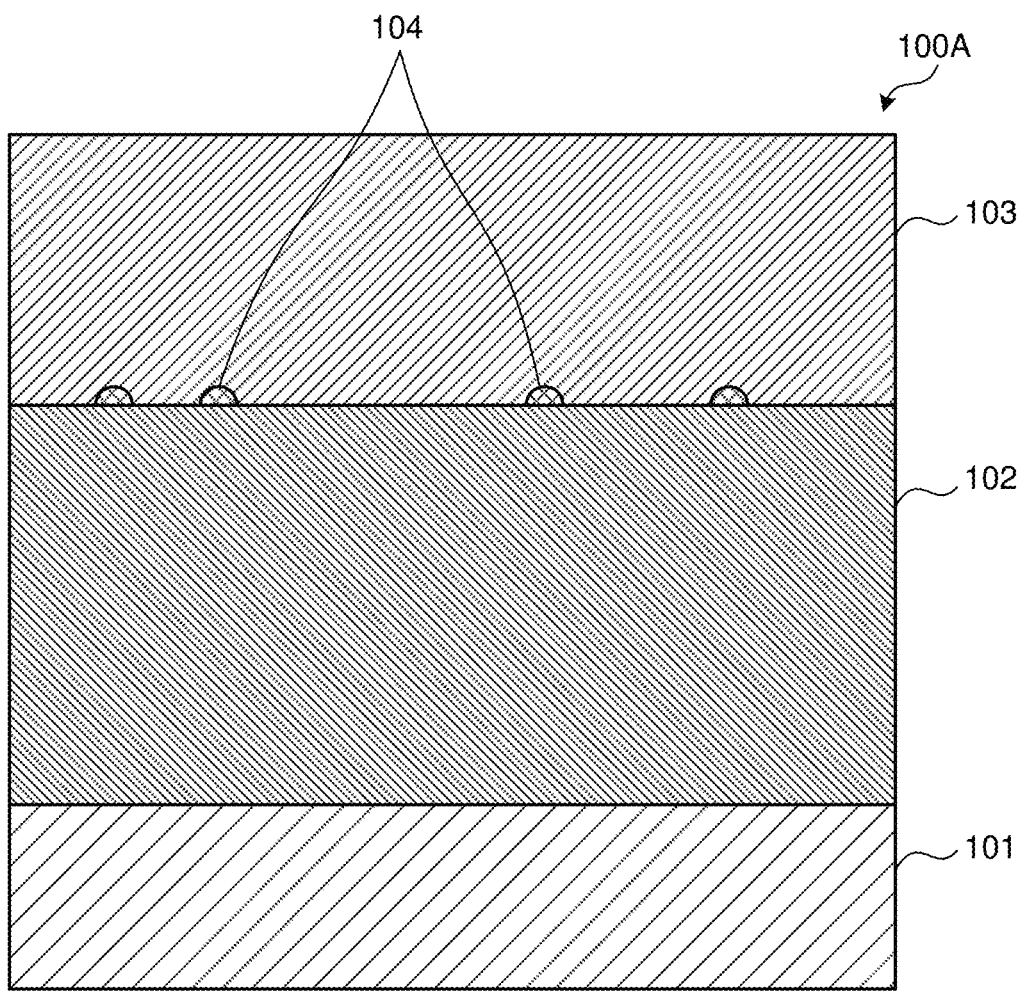
FIG. 9 is a diagram that illustrates an example of a structure of a semiconductor device according to a variation of an embodiment.

Although a semiconductor device with an MIM structure has been explained as an example in an embodiment as described above, it is also possible to apply a disclosed technique to a semiconductor device with a MOS (Metal-Oxide-Semiconductor) structure. FIG. 9 is a diagram that illustrates an example of a structure of a semiconductor device 100A according to a variation of an embodiment. The semiconductor device 100A as illustrated in FIG. 9 is a semiconductor device with a MOS structure. The semiconductor device 100A has a semiconductor substrate 101, a dielectric film 102 that is formed on the semiconductor substrate 101, and an upper electrode 103 that is formed on the dielectric film 102. In the semiconductor device 100A with a MOS structure, the dielectric film 102 is utilized as a gate insulating film. A metal oxide film 104 with an insulation property is locally formed in a predetermined area (that is, a grain boundary peripheral area) on a surface of the dielectric film 102. In the semiconductor device 100A with a MOS structure, the upper electrode 103 is utilized as a gate electrode.

In a manufacturing method for the semiconductor device 100A according to a variation, a semiconductor substrate 101 is provided in a step at step S101 in an embodiment. Furthermore, in the manufacturing method for the semiconductor device 100A, a dielectric film 102 is formed on the semiconductor substrate 101 in a step at step S102 in an embodiment. In the manufacturing method for the semiconductor device 100A according to a variation, a process from attachment of a metal 104a (step S103) to formation of an upper electrode 103 (step S105) is similar to that of an embodiment.

Thus, also in the semiconductor device 100A with a MOS structure, a metal oxide film 104 is formed in a grain boundary peripheral area on a surface of the dielectric film 102 prior to formation of the upper electrode 103. Thereby, it is possible to reduce a leakage current of the dielectric film 102 without increasing a CET thereof.

Effect

A manufacturing method for a semiconductor device according to an embodiment as described above includes a step of forming a dielectric film on a lower electrode that is formed on a semiconductor substrate or in a semiconductor substrate, a step of attaching a metal to a predetermined area on a surface of the dielectric film selectively, a step of forming a metal oxide film with an insulation property in the predetermined area on a surface of the dielectric film by applying heat treatment to the metal, and a step of forming an upper electrode on the dielectric film in a state where the metal oxide film is formed in the predetermined area on a surface of the dielectric film. Hence, according to an embodiment, it is possible to reduce a leakage current of a dielectric film without increasing a CET thereof.

Furthermore, in an embodiment, the step of attaching a metal may be to attach a metal to an area that includes a periphery of a crystal grain boundary that is exposed to a surface of the dielectric film selectively. Hence, according to an embodiment, it is possible to reduce or prevent generation of a leakage current of a dielectric film on a surface thereof.

Furthermore, in an embodiment, the step of attaching a metal may be to attach a metal to an area that includes a periphery of a crystal grain boundary that is exposed to a surface of the dielectric film selectively by executing a plating process that uses an electron(s) that is/are conducted through a crystal grain boundary that is present in the dielectric film. Hence, according to an embodiment, it is possible to attach a metal to only a periphery of a crystal grain boundary that is exposed to a surface of a dielectric film accurately.

Furthermore, in an embodiment, the metal may include aluminum (Al) or a pentavalent transition metal. Furthermore, in an embodiment, the pentavalent transition metal may include niobium (Nb) or tantalum (Ta). Furthermore, in an embodiment, the dielectric film may include hafnium oxide (HfO2) or zirconium oxide (ZrO2). Hence, according to an embodiment, it is possible to reduce a leakage current of a dielectric film without increasing a CET thereof by using a metal oxide film with an insulation property that is formed from aluminum (Al) or a pentavalent transition metal.

Furthermore, in an embodiment, the step of forming a metal oxide film may be executed at a temperature of 300° C. or lower. Hence, according to an embodiment, it is possible to grow a metal oxide film on a surface of a dielectric film properly.

Others

Additionally, a technique as disclosed in the present application is not limited to an embodiment as described above and a variety of modifications are possible within a scope of an essence thereof.

For example, an embodiment as described above may further include a step of annealing the metal oxide film under an inert atmosphere between the step of forming a metal oxide film (step S104) and the step of forming a lower electrode (step S105). Furthermore, in such a case, it is preferable that the step of annealing the metal oxide film is executed at a temperature of 500° C. or lower. Thereby, it is possible to grow a metal oxide film properly to a crystal grain boundary that is present in a dielectric film, and as a result, it is possible to further reduce a leakage current thereof.

Furthermore, an embodiment as described above may further include a step of annealing the dielectric film under an inert atmosphere between the step of forming a dielectric film (step S102) and the step of attaching a metal (step S103). Furthermore, in such a case, it is preferable that the step of annealing the dielectric film is executed at a temperature of 500° C. or lower. Thereby, it is possible to crystalize a dielectric film moderately.

It should be considered that each embodiment that is disclosed herein is/are not limitative but is/are illustrative in all aspects. An embodiment(s) as described above may be omitted, substituted, and/or modified in a wide variety of modes without departing from an appended claim(s) and an essence thereof.

According to the present disclosure, an effect is provided in such a manner that it is possible to reduce a leakage current of a dielectric film without increasing a CET thereof.

While certain embodiment has been described, this embodiment has been presented by way of example only, and is not intended to limit the scope of the disclosures. Indeed, the embodiment described herein may be embodied in a variety of other forms. Furthermore, various omissions, substitutions and changes in the form of the embodiment described herein may be made without departing from the spirit of the disclosures. The accompanying claims and their equivalents are intended to cover such forms or modifications as would fall within the scope and spirit of the disclosures.

The invention claimed is:

1. A manufacturing method for a semiconductor device, including:
    forming a dielectric film on a semiconductor substrate or on a lower electrode that is formed on a semiconductor substrate;
    attaching a metal to a predetermined area on a surface of the dielectric film selectively;
    forming a metal oxide film with an insulation property in the predetermined area on the surface of the dielectric film by applying heat treatment to the metal; and
    forming an upper electrode on the dielectric film in a state where the metal oxide film is formed in the predetermined area on the surface of the dielectric film,
    wherein the attaching a metal includes attaching a metal to an area that includes a periphery of a crystal grain boundary that is exposed to the surface of the dielectric film selectively.

2. The manufacturing method for a semiconductor device according to claim 1, wherein
    the attaching a metal includes attaching a metal to the area that includes the periphery of the crystal grain boundary that is exposed to the surface of the dielectric film selectively by executing a plating process that uses an electron(s) that is/are conducted through a crystal grain boundary that is present in the dielectric film.

3. The manufacturing method for a semiconductor device according to claim 1, wherein
    the metal includes aluminum (Al) or a pentavalent transition metal.

4. The manufacturing method for a semiconductor device according to claim 3, wherein
    the pentavalent transition metal includes niobium (Nb) or tantalum (Ta).

5. The manufacturing method for a semiconductor device according to claim 1, wherein
    the dielectric film includes hafnium oxide ($HfO_2$) or zirconium oxide ($ZrO_2$).

6. The manufacturing method for a semiconductor device according to claim 1, wherein
    the forming a metal oxide film is executed at a temperature of 300° C. or lower.

7. The manufacturing method for a semiconductor device according to claim 1, further including
    annealing the metal oxide film under an inert atmosphere between the forming a metal oxide film and the forming an upper electrode.

8. The manufacturing method for a semiconductor device according to claim 7, wherein
    the annealing the metal oxide film is executed at a temperature of 500° C. or lower.

9. A manufacturing method for a semiconductor device, including:
    forming a dielectric film on a semiconductor substrate or on a lower electrode that is formed on a semiconductor substrate;
    attaching a metal to a predetermined area on a surface of the dielectric film selectively;
    forming a metal oxide film with an insulation property in the predetermined area on the surface of the dielectric film by applying heat treatment to the metal; and
    forming an upper electrode on the dielectric film in a state where the metal oxide film is formed in the predetermined area on the surface of the dielectric film, wherein
    the attaching the metal includes executing a plating process that uses an electron(s) that is/are conducted through a crystal grain boundary that is present in the dielectric film.

* * * * *